US012352000B1

(12) United States Patent
Huang et al.

(10) Patent No.: US 12,352,000 B1
(45) Date of Patent: Jul. 8, 2025

(54) LABORATORY EXPERIMENT SYSTEM FOR BREACHING OF DEBRIS-TYPED BARRIER DAM

(71) Applicant: Changjiang River Scientific Research Institute, Wuhan (CN)

(72) Inventors: Wei Huang, Wuhan (CN); Wengang Duan, Wuhan (CN); Qigui Yang, Wuhan (CN); Duan Chen, Wuhan (CN); Yufang Ni, Wuhan (CN); Qingyuan Yang, Wuhan (CN); Huiqun Cao, Wuhan (CN)

(73) Assignee: Changjiang River Scientific Research Institute, Wuhan (CN)

( * ) Notice: Subject to any disclaimer, the term of this patent is extended or adjusted under 35 U.S.C. 154(b) by 0 days.

(21) Appl. No.: 19/050,216

(22) Filed: Feb. 11, 2025

(30) Foreign Application Priority Data

Aug. 2, 2024 (CN) .......................... 202411056337.4

(51) Int. Cl.
*E02B 1/02* (2006.01)
*G01M 10/00* (2006.01)
*G06F 30/28* (2020.01)

(52) U.S. Cl.
CPC ............... *E02B 1/02* (2013.01); *G01M 10/00* (2013.01); *G06F 30/28* (2020.01)

(58) Field of Classification Search
CPC ........... E02B 1/02; G01M 10/00; G06F 30/28
See application file for complete search history.

(56) References Cited

U.S. PATENT DOCUMENTS 5,277,585 A * 1/1994 Aminighazvini ...... G09B 25/06
434/152

OTHER PUBLICATIONS

Changjiang River Scientific Research Institute of Changjiang Water Resources Commission (Applicant), Replacement claims (allowed) of CN202411056337.4, Oct. 17, 2024.
CNIPA, Notification to grant patent right for invention in CN202411056337.4, Oct. 24, 2024.

* cited by examiner

*Primary Examiner* — Paul M. West
(74) *Attorney, Agent, or Firm* — Hemisphere Law, PLLC; Zhigang Ma (57) ABSTRACT

Provided is a laboratory experiment system including an upstream reservoir. A main river channel is connected to a water outlet of the upstream reservoir. A barrier dam is built up in the main river channel. Uneroded dam bodies are constructed on two side surfaces of the barrier dam. A branch river channel extends on a surface of the barrier dam. A material hopper is connected to a feed inlet of the branch river channel. River banks are constructed on outer sides of the uneroded dam bodies. The feed inlet is docked with a descending conveyor belt. A feeding end of the descending conveyor belt is docked with an ascending conveyor belt. A discharge end of the material hopper defines a bottom hole. The bottom hole is connected to a material pipe. A discharge end of the material pipe corresponds to an inner side of the ascending conveyor belt.

8 Claims, 5 Drawing Sheets

LABORATORY EXPERIMENT SYSTEM FOR BREACHING OF DEBRIS-TYPED BARRIER DAM

CROSS-REFERENCE TO RELATED APPLICATION

This application claims priority to Chinese patent application No. CN 202411056337.4, filed to China National Intellectual Property Administration (CNIPA) on Aug. 2, 2024, which is herein incorporated by reference in its entirety.

TECHNICAL FIELD

The present disclosure relates to the technical field of tests, and particularly to a laboratory experiment system for breaching of a debris-typed barrier dam.

BACKGROUND

The Chinese patent application with an application number of CN202410006314.6 (a corresponding publication number is CN117804731A) discloses a test method and a test device for simulating the formation and breach of a barrier dam in a narrow and deep valley, which aims at solving the problems of poorer accuracy and higher consumption of manpower and material resources in an existing method for simulating breach of a barrier dam. A solution of this Chinese patent application mainly includes: constructing a test device; controlling a water supply module to form an upstream inflow, equipping an earth material sliding module with earth materials which can completely block a water course, and controlling the earth materials in the earth material sliding module to slide into a water course model to accumulate and form a barrier dam body; in response to the earth materials sliding into the water course model completely blocking the water course, obtaining test operational parameters; determining whether the barrier dam will experience breaching under the test operational parameters, and if so, simulating a formation and break process of the barrier dam in the narrow and deep valley; and using a monitoring module to record image data and test data in the process of simulating the formation and breach of the barrier dam in the narrow and deep valley. This patent application improves the accuracy of simulation of the breach of the barrier dam and reduces the consumption of manpower and material resources, and is suitable for the narrow and deep river valley.

An experimental simulation technology of breach of a debris-typed barrier dam aims to predict and evaluate the process and influence of the breach of the debris-typed barrier dam through a simulation means. The existing simulation system uses a material hopper to add materials, and controls a flow rate of a debris flow into a water course by adjusting a height and slope of a chute, thereby simulating a process of the debris flow blocking the water course and thus forming a dam body under different mainstream flow rates. After the formation of a debris-typed barrier dam, with the upstream inflow, a water level of an upstream reservoir rises, which makes water overflow a top of the debris-typed barrier dam, leading to the breach of the debris-typed barrier dam.

Because the movement of debris flow is strongly unsteady, it is difficult to accurately control an inflow velocity of debris flow by changing a height of the chute in the related art. Complicated physical processes such as bottom friction, internal particle collision, sediment erosion and deposition during the process of debris flow flowing down the chute will cause a velocity of the debris flow to be uncertain when the debris flow flows into a main water course. Further, when simulating a higher inflow velocity, the existing simulation technology needs a larger chute height and imposes higher demands on an experimental site, and an extension of a debris flow transportation process will further expand a velocity error. Moreover, an increase in height and the extension of the chute will increase the demand for a volume of the material hopper, and thus increase the difficulty of material lifting.

SUMMARY

Based on the technical problems of poorer controllability and higher site requirements in the background technology, the present disclosure provides a laboratory experiment system for breaching of a debris-typed barrier dam.

In an embodiment, a laboratory experiment system for breaching of a debris-typed barrier dam is provided. The laboratory experiment system includes an upstream reservoir. A main river channel is connected to a water outlet of the upstream reservoir, the debris-typed barrier dam is built up in the main river channel, and uneroded dam bodies are constructed on two side surfaces of the barrier dam. A branch river channel extends on a surface of the debris-typed barrier dam, and a material hopper is connected to a feed inlet of the branch river channel. River banks are constructed on outer sides of the uneroded dam bodies, the feed inlet of the branch river channel is docked with a descending conveyor belt, a feeding end of the descending conveyor belt is docked with an ascending conveyor belt, a discharge end of the material hopper defines a bottom hole, the bottom hole of the material hopper is connected to a material pipe, and a discharge end of the material pipe corresponds to an inner side of the ascending conveyor belt. An adjusting mechanism is hinged between a bottom of the descending conveyor belt and a bottom of the ascending conveyor belt, and a surface of the adjusting mechanism is rotatably sleeved with a lifting mechanism. With the above laboratory experiment system, an accuracy of a simulation result is improved, and a construction cost of a simulation test is saved. The ascending conveyor belt and the descending conveyor belt are used to control an inflow velocity, which avoids the uncertainty and randomness of slope control and debris flow movement itself, improves the accuracy of the simulation result, and is beneficial to the prediction and evaluation of the burst process and influence of the debris-typed barrier dam. Further, the segmented conveying method is not only applicable to various inflow velocities but also allows for easy addition at any time, saving the costs associated with the construction of inclined chutes and material lifting in related art.

In an embodiment, the adjusting mechanism includes: a base, a rotary frame, a supporting column and a frame, a right side of a top of the base is rotatably connected to a right end of the rotary frame, a number of the supporting column is two, two sides of a top of the rotary frame are respectively bolted to bottoms of the two supporting columns, the bottoms of the descending conveyor belt and the ascending conveyor belt are respectively hinged with two top ends of the two supporting columns, a bottom of the frame is bolted to the top of the rotary frame, and the lifting mechanism is connected to the frame. The base can be fixed on a ground and can drive the rotary frame to rotate, and the rotary frame can drive the two supporting columns to move, and the two supporting columns can drive the descending belt conveyor and the ascending belt conveyor.

In an embodiment, a bottom of the rotary frame is rotatably connected to a roller, a surface of the roller is slidably connected to the top of the base, a right side of the top of the rotary frame is bolted to a rotary motor, and an output end of the rotary motor is disposed in a hole of the base. The roller is configured to support the rotary frame and facilitate rotation of the rotary frame, and the rotary motor is configured to drive the rotary frame to rotate.

In an embodiment, the lifting mechanism includes: a rotary rod, a main sprocket, a chain and a driving assembly, a left end of the rotary rod is connected to an axis center of the main sprocket, a tooth of the main sprocket is meshed with an inner side of the chain, and the chain is meshed with the driving assembly. When the rotary rod is rotated, the rotary rod can drive the main sprocket to rotate, and the main sprocket can drive the driving assembly to rotate.

In an embodiment, the driving assembly includes: an auxiliary sprocket, a connecting shaft, a main bevel gear and a transmission assembly, a top end of the chain inside the chain is meshed with a tooth of the auxiliary sprocket, and an axis center of the auxiliary sprocket is connected to a left end of the connecting shaft; and a number of the main bevel gear is two, axis centers of the two main bevel gears are connected to a surface of the connecting shaft, and the two main bevel gears are meshed with the transmission assembly. The chain can drive the auxiliary sprocket to rotate. A size of the auxiliary sprocket is smaller than a size of the main sprocket, which can produce an accelerating effect on the auxiliary sprocket. The auxiliary sprocket can drive the connecting shaft to rotate, the connecting shaft can drive the two main bevel gears to rotate.

In an embodiment, the transmission assembly includes an auxiliary bevel gear, a screw rod, a slide bar and a lifting assembly; and a number of the auxiliary bevel gear is two, a number of the screw rod is two, a tooth of each of the two main bevel gears is meshed with a tooth of a corresponding one of the two auxiliary bevel gears, axis centers of the two auxiliary bevel gear are respectively connected to bottom ends of the two screw rods, the two screw rods are threadedly connected to threaded holes of the slide bar, and the slide bar is hinged to the lifting component. The main bevel gear can drive the two auxiliary bevel gears to rotate, the two auxiliary bevel gears can drive the two screw rods to rotate, the two screw rods can drive the slide bar to move up and down, and the slide bar can drive the lifting component to move up and down.

In an embodiment, the lifting assembly includes a sliding frame, a transmission frame and a transmission rod; a number of the sliding frame is two, a number of the transmission frame is two, and a number of the transmission rod is two; rear sides of the two sliding frames are hinged with a surface of the slide bar, the two sliding frames are slidably connected to two surfaces of the two transmission frames, respectively, the two transmission frames are hinged with the frame, an end of each of the two transmission frames facing away from the frame is hinged with a bottom end of a corresponding one transmission rod of the two transmission rods, and a surface of the descending conveyor belt and a surface of the ascending conveyor belt are respectively hinged with two top ends of the two transmission rods. The slide bar can drive the two sliding frames to move. The two sliding frames can respectively slide on two surfaces of the two transmission frames and drive respectively the two transmission frames to rotate. The two transmission frames are rotatably disposed on the slide bar through bearings. The two transmission frames can respectively drive the two transmission rods to move, and the two transmission rods can drive the descending conveyor belt and the ascending conveyor belt to rotate, so as to adjust a tilting angle of the material discharge.

In an embodiment, two ends of the rotary rod are rotatably sleeved with an inner side of the frame, the two ends of the rotary rod extend to an outer side of the frame and are respectively connected to two rotating handles; and two ends of the connecting shaft are rotatably sleeved with the inner side of the frame. The rotary rod is rotatably connected to the frame through bearings, thereby ensuring the rotation stability of the rotary rod. The two rotating handles are configured to drive the rotary rod to rotate. The connecting shaft is rotatably connected to the frame through bearings.

In an embodiment, the bottom end of each of the two screw rods is rotatably sleeved with an inner side of the frame, a rear side of the slide bar is slidably connected to a limiting frame, and a rear side of the limiting frame is bolted to the inner side of the frame. The two screw rods are rotatably connected to the frame through bearings, thereby ensuring the rotation stability of the two screw rods, and the limiting frame is configured to guide the slide bar to facilitate the up-and-down movement of the slide bar.

In an embodiment, each of the descending conveyor belt and the ascending conveyor belt includes a U-shaped conveyor belt, a rotating shaft, a supporting frame and an adjustable speed motor; and an inner side of supporting frame is rotatably connected to two ends of the rotating shaft, the supporting frame is bolted to the adjustable speed motor, the adjustable speed motor is connected to the rotating shaft, and an inner side of the U-shaped conveyor belt is rotatably connected to a surface of the rotating shaft. The adjustable speed motor is configured to drive the rotating shaft to rotate. The rotating shaft is configured to drive the U-shaped conveyor belt to rotate, so a rotating speed of the U-shaped conveyor belt can be adjusted by the adjustable speed motor. The U-shaped conveyor belt is in close contact with the rotating shaft and is configured to rotate with the rotation of the rotating shaft. The transmission rod is configured to drive the supporting frame to rotate.

The above laboratory experiment system of the present disclosure has at least the following beneficial effects. An accuracy of a simulation result is improved, and a construction cost of a simulation test is saved. The ascending conveyor belt and the descending conveyor belt are used to control an inflow velocity, which avoids the uncertainty and randomness of slope control and debris flow movement itself, improves the accuracy of the simulation result, and is beneficial to the prediction and evaluation of the burst process and influence of the debris-typed barrier dam. Further, the segmented conveying method is not only applicable to various inflow velocities but also allows for easy addition at any time, saving the costs associated with the construction of inclined chutes and material lifting in related art.

REFERENCE NUMERALS

1. Large-capacity upstream reservoir; 2. Debris-typed barrier dam; 3. Main river channel; 4. Material hopper; 5. Debris flow branch river channel; 6. Uneroded dam bodies; 7. River banks; 8. Rotating shaft; 9. Descending conveyor belt; 10. Supporting column; 11. Ascending conveyor belt; 12. Material pipe; 13. Bottom hole; 14. Adjustable speed motor; 15. U-shaped conveyor belt; 16. Supporting frame; 17. Rotary motor; 18. Base; 19. Rotary frame; 20. Frame; 21. Rotary rod; 22. Main sprocket; 23. Chain; 24. Auxiliary sprocket; 25. Connecting shaft; 26. Main bevel gear; 27. Auxiliary bevel gear; 28. Screw rod; 29. Slide bar; 30. Sliding frame; 31. Transmission frame; 32. Transmission rod; 34. Feed inlet; 35. Feeding end; 36. Discharge end; 37. Threaded hole; 38. Rotating handle; 39. Limiting frame; 40. Tooth; 41. Tooth; 42. Tooth; 43. Tooth; 44. Discharge end; 45. Left end; 46. Axis center; 47. Axis center; 48. Left end; 49. Axis center.

DETAILED DESCRIPTION OF EMBODIMENTS

The present disclosure will be further explained in combined with specific embodiments.

Embodiments

Referring to FIGS. 1-6, a laboratory experiment system for breaching of a debris-typed barrier dam is proposed in this embodiment, which includes a large-capacity upstream reservoir 1. A main river channel 3 is connected to a water outlet of the large-capacity upstream reservoir 1. A debris-typed barrier dam 2 is built up in the main river channel 3. Uneroded dam bodies 6 are constructed on two side surfaces of the debris-typed barrier dam 2. A debris flow branch river channel 5 extends on a surface of the debris-typed barrier dam 2. A material hopper 4 is connected to a feed inlet 34 of the debris flow branch river channel 5. River banks 7 are constructed on outer sides of the uneroded dam bodies 6. The feed inlet 34 of the debris flow branch river channel 5 is docked with a descending conveyor belt 9. A feeding end 35 of the descending conveyor belt 9 is docked with an ascending conveyor belt 11. A discharge end 36 of the material hopper 4 defines a bottom hole 13. The bottom hole 13 of the material hopper 4 is connected to a material pipe 12. A discharge end 44 of the material pipe 12 corresponds to an inner side of the ascending conveyor belt 11. An adjusting mechanism is hinged between a bottom of the descending conveyor belt 9 and a bottom of the ascending conveyor belt 11, and a surface of the adjusting mechanism is rotatably sleeved with a lifting mechanism.

The adjusting mechanism includes a base 18, a rotary frame 19, a supporting column 10 and a frame 20. A right side of a top of the base 18 is rotatably connected to a right end of the rotary frame 19. A number of the supporting column 10 is two. Two sides of a top of the rotary frame 19 are respectively bolted to two bottoms of the two supporting columns 10. The bottoms of the descending conveyor belt 9 and the ascending conveyor belt 11 are respectively hinged with two top ends of the two supporting columns 10. A bottom of the frame 20 is bolted to the top of the rotary frame 19, and the lifting mechanism is connected to the frame 20. The base 18 can be fixed on a ground and can drive the rotary frame 19 to rotate, and the rotary frame 19 can drive the two supporting columns 10 to move, and the two supporting columns 10 can drive the descending belt conveyor 9 and the ascending belt conveyor 11.

A bottom of the rotary frame 19 is rotatably connected to a roller, and a surface of the roller is slidably connected to the top of the base 18. A right side of the top of the rotary frame 19 is bolted to a rotary motor 17, and an output end of the rotary motor 17 is disposed in a hole of the base 18. The roller is configured to support the rotary frame 19 and facilitate rotation of the rotary frame 19, and the rotary motor 17 is configured to drive the rotary frame 19 to rotate.

Figure 4:
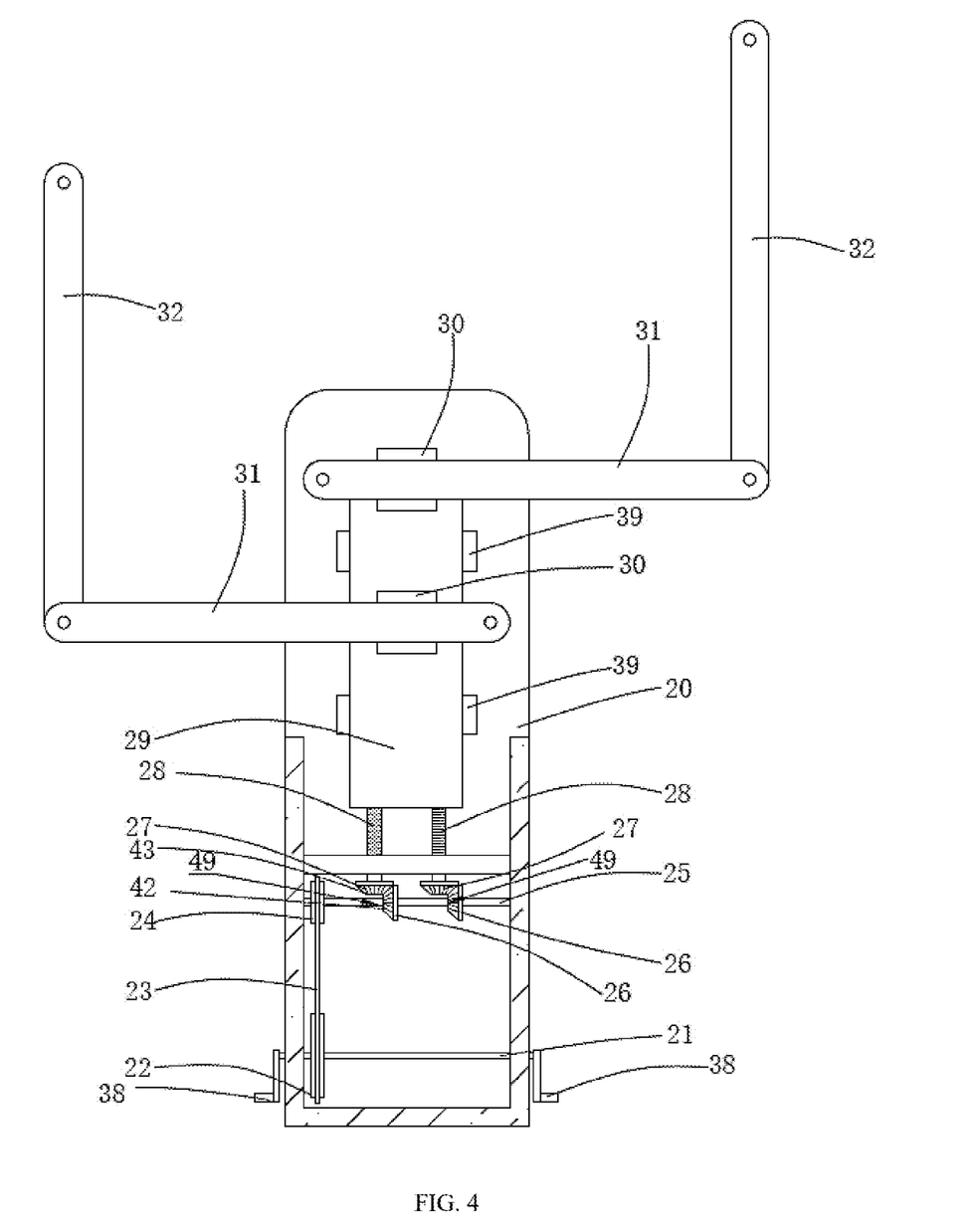
FIG. 4 illustrates a schematic internal structural diagram of a frame of a laboratory experiment system for breaching of a debris-typed barrier dam according to an embodiment of the present disclosure.
Figure 5:
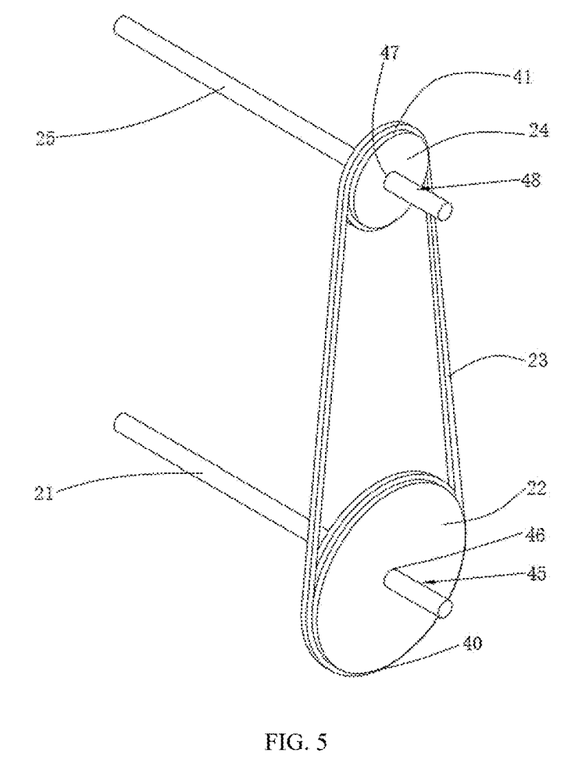
FIG. 5 illustrates a three-dimensional structural diagram of a main sprocket of a laboratory experiment system for breaching of a debris-typed barrier dam according to an embodiment of the present disclosure.

The lifting mechanism includes a rotary rod 21, a main sprocket 22, a chain 23 and a driving assembly. A left end 45 of the rotary rod 21 is connected to an axis center 46 of the main sprocket 22, a tooth 40 of the main sprocket 22 is meshed with an inner side of the chain 23, and the chain 23 is meshed with the driving assembly. When the rotary rod 21 is rotated, the rotary rod 21 can drive the main sprocket 22 to rotate, and the main sprocket 22 can drive the driving assembly to rotate.

The driving assembly includes an auxiliary sprocket 24, a connecting shaft 25, a main bevel gear 26 and a transmission assembly. A top end of the chain 23 inside the chain 23 is meshed with a tooth 41 of the auxiliary sprocket 24, and an axis center 47 of the auxiliary sprocket 24 is connected to a left end 48 of the connecting shaft 25. A number of the main bevel gear 26 is two, and axis centers 49 of the two main bevel gears 26 are connected to a surface of the connecting shaft 25. The two main bevel gears 26 are meshed with the transmission assembly, and the chain 23 can drive the auxiliary sprocket 24 to rotate. A size of the auxiliary sprocket 24 is smaller than a size of the main sprocket 22, which can produce an accelerating effect on the auxiliary sprocket 24. The auxiliary sprocket 24 can drive the connecting shaft 25 to rotate, the connecting shaft 25 can drive the two main bevel gears 26 to rotate, and the two main bevel gears 26 can drive the transmission assembly to rotate.

Figure 6:
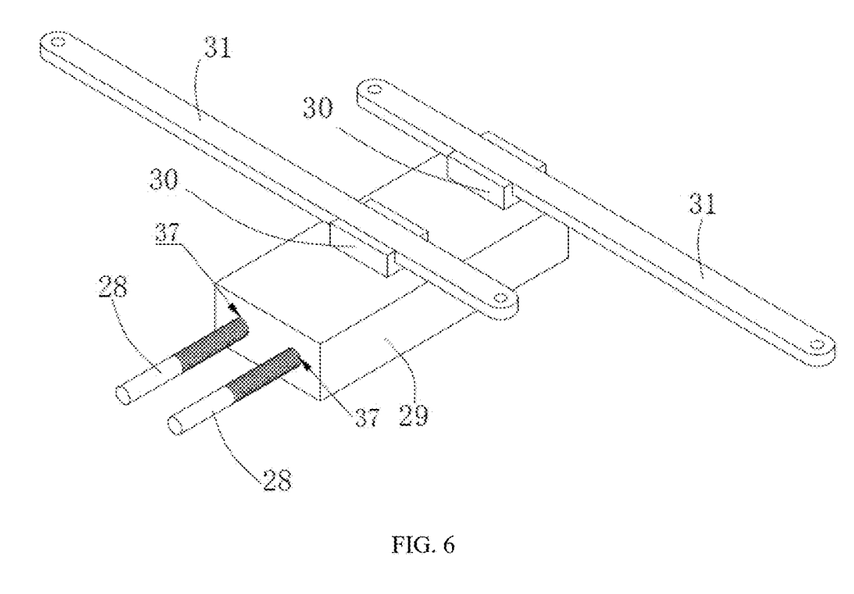
FIG. 6 illustrates a three-dimensional structural diagram of a slide bar of a laboratory experiment system for breaching of a debris-typed barrier dam according to an embodiment of the present disclosure.

The transmission assembly includes an auxiliary bevel gear 27, a screw rod 28, a slide bar 29 and a lifting assembly. A number of the auxiliary bevel gear 27 is two, and a number of the screw rod 28 is two. A tooth 42 of each main bevel gear 26 is meshed with a tooth 43 of each auxiliary bevel gear 27. Axis centers of the two auxiliary bevel gear 27 are respectively connected to bottom ends of the two screw rods 28. The two screw rods 28 are threadedly connected to threaded holes 37 of the slide bar 29. The slide bar 29 is hinged to the lifting component. The main bevel gear 26 can drive the two auxiliary bevel gears 27 to rotate, the two auxiliary bevel gears 27 can drive the two screw rods 28 to rotate, the two screw rods 28 can drive the slide bar 29 to move up and down, and the slide bar 29 can drive the lifting component to move up and down.

The lifting assembly includes a sliding frame 30, a transmission frame 31 and a transmission rod 32. A number of the sliding frame 30 is two. A number of the transmission frame 31 is two. A number of the transmission rod 32 is two. Rear sides of the two sliding frames 30 are hinged with a surface of the slide bar 29. The two sliding frames 30 are slidably connected to two surfaces of the two transmission frames 31, respectively. The two transmission frames 31 are hinged with the frame 20. An end of each transmission frame 31 facing away from the frame 20 is hinged with a bottom end of a corresponding one transmission rod 32 of the two transmission rods 32. A surface of the descending conveyor belt 9 and a surface of the ascending conveyor belt 11 are respectively hinged with two top ends of the two transmission rods 32. The slide bar 29 can drive the two sliding frames 30 to move. The two sliding frames 30 can respectively slide on two surfaces of the two transmission frames 31 and drive respectively the two transmission frames 31 to rotate. The two transmission frames 31 are rotatably disposed on the slide bar 29 through bearings. The two transmission frames 31 can respectively drive the two transmission rods 32 to move, and the two transmission rods 32 can drive the descending conveyor belt 9 and the ascending conveyor belt 11 to rotate, so as to adjust a tilting angle of the material discharge.

Two ends of the rotary rod 21 are rotatably sleeved with an inner side of the frame 20. The two ends of the rotary rod 21 extend to an outer side of the frame 20 and are respectively connected to two rotating handles 38. Two ends of the connecting shaft 25 are rotatably sleeved with the inner side of the frame 20. The rotary rod 21 is rotatably connected to the frame 20 through bearings, thereby ensuring the rotation stability of the rotary rod 21. The two rotating handles 38 are configured to drive the rotary rod 21 to rotate. The connecting shaft 25 is rotatably connected to the frame 20 through bearings.

The bottom end of each of the two screw rods 28 is rotatably sleeved with an inner side of the frame 20. A rear side of the slide bar 29 is slidably connected to a limiting frame 39. A rear side of the limiting frame 39 is bolted to the inner side of the frame 20. The two screw rods 28 are rotatably connected to the frame 20 through bearings, thereby ensuring the rotation stability of the two screw rods 28, and the limiting frame 39 is configured to guide the slide bar 29 to facilitate the up-and-down movement of the slide bar 29.

Figure 1:
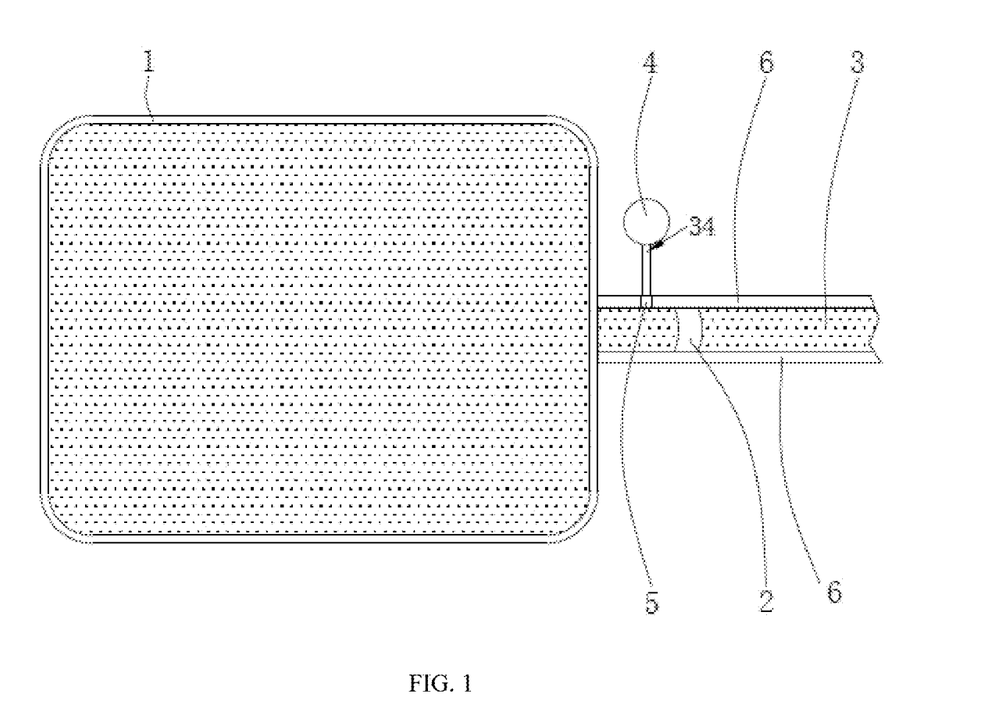
FIG. 1 illustrates a schematic top view of a laboratory experiment system for breaching of a debris-typed barrier dam according to an embodiment of the present disclosure.
Figure 2:
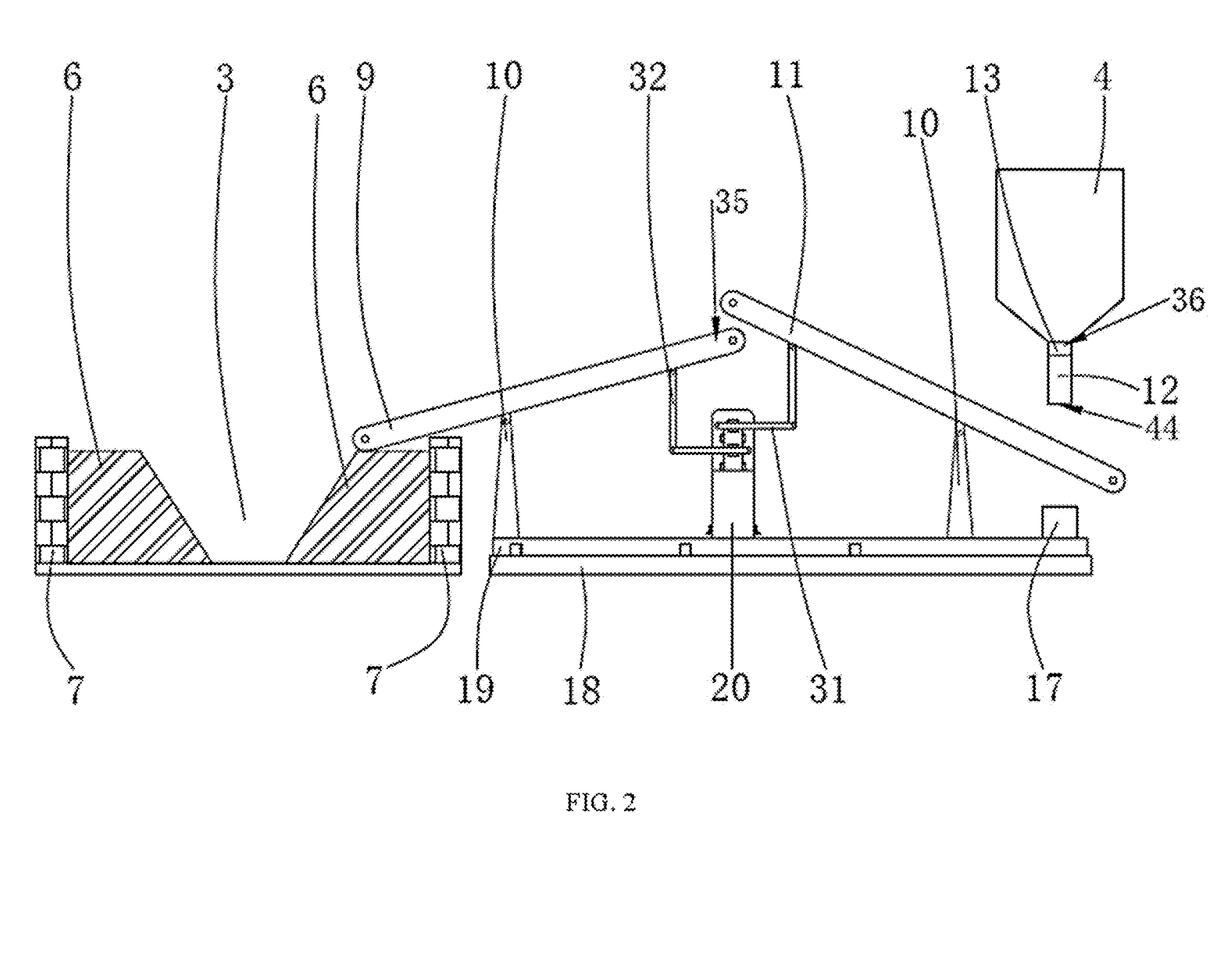
FIG. 2 illustrates a schematic front view of a main river channel of a laboratory experiment system for breaching of a debris-typed barrier dam according to an embodiment of the present disclosure.
Figure 3:
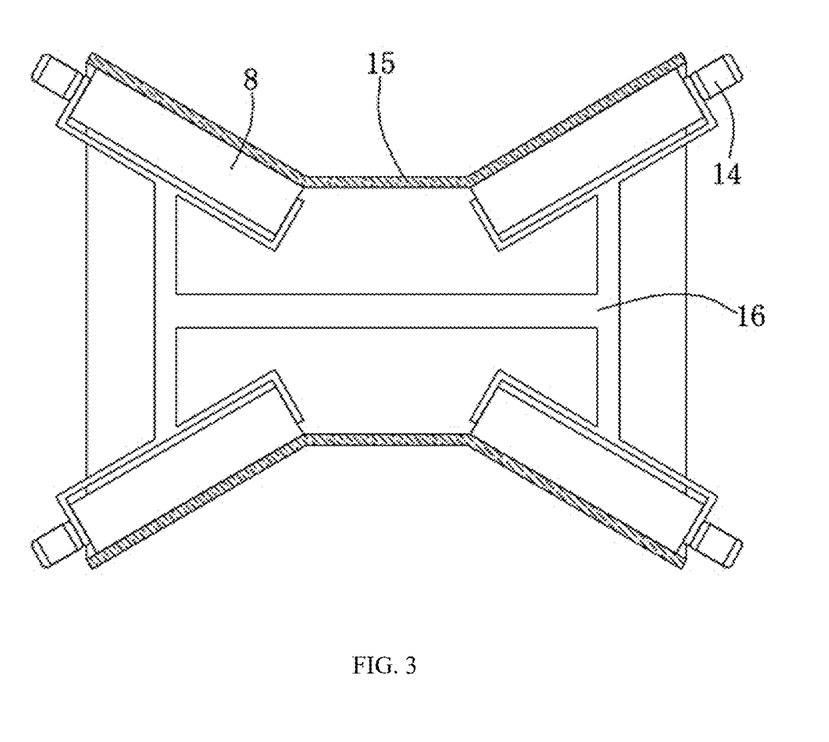
FIG. 3 illustrates a schematic left view of a supporting frame of a laboratory experiment system for breaching of a debris-typed barrier dam according to an embodiment of the present disclosure.

Each of the descending conveyor belt 9 and the ascending conveyor belt 11 includes a U-shaped conveyor belt 15, a rotating shaft 8, a supporting frame 16 and an adjustable speed motor 14. An inner side of supporting frame 16 is rotatably connected to two ends of the rotating shaft 8. The supporting frame 16 is bolted to the adjustable speed motor 14, and the adjustable speed motor 14 is connected to the rotating shaft 8. An inner side of the U-shaped conveyor belt 15 is rotatably connected to a surface of the rotating shaft 8. The adjustable speed motor 14 is configured to drive the rotating shaft 8 to rotate. The rotating shaft 8 is configured to drive the U-shaped conveyor belt 15 to rotate, so a rotating speed of the U-shaped conveyor belt 15 can be adjusted by the adjustable speed motor 14. The U-shaped conveyor belt 15 is in close contact with the rotating shaft 8 and is configured to rotate with the rotation of the rotating shaft 8. The transmission rod 32 is configured to drive the supporting frame 16 to rotate.

With the above laboratory experiment system, an accuracy of a simulation result is improved, and a construction cost of a simulation test is saved. The ascending conveyor belt 11 and the descending conveyor belt 9 are used to control an inflow velocity, which avoids the uncertainty and randomness of slope control and debris flow movement itself, improves the accuracy of the simulation result, and is beneficial to the prediction and evaluation of the burst process and influence of the debris-typed barrier dam 2. Further, the segmented conveying method is not only applicable to various inflow velocities but also allows for easy addition at any time, saving the costs associated with the construction of inclined chutes and material lifting in related art.

A working principle of the laboratory experiment system is as follows. Materials in the material hopper 4 enter the main river channel 3 through the debris flow branch river channel 5, and thus the materials block the main river channel 3 to form the debris-typed barrier dam 2. As upstream water enters the large-capacity upstream reservoir 1, a water level of the large-capacity upstream reservoir 1 keeps rising. After the water level overflows a top of the debris-typed barrier dam 2, the debris-typed barrier dam 2 breaches, and the materials in the material hopper 4 enter the ascending conveyor belt 11 through the bottom hole 13 and the material pipe 12. Through a rotation of the rotating shaft 8, the materials are lifted to enter the descending conveyor belt 9. Under a reverse rotation of the rotating shaft 8, the materials enter the main river channel 3, and the adjustable speed motor 14 drives the rotating shaft 8 to rotate, thereby driving the U-shaped conveyor belt 15 to rotate. As such, a rotating speed of the whole U-shaped conveyor belt 15 can be adjusted by the adjustable speed motor 14, and a belt conveyor system only simulates the flow in one direction, while a process of breach of the debris-typed barrier dam 2 often involves complex terrain changes. Therefore, a multi-directional adjustable terrain simulation device can be designed, which can simulate the flow in different slopes and directions, so as to improve the simulation accuracy of the experiment. Therefore, a power supply of the rotary motor 17 can be turned on, the rotary motor 17 is controlled by a motor controller, the rotary motor 17 can drive the rotary frame 19 to rotate, which can rotate on the base 18 and drive the supporting column 10 to move. The supporting column 10 can drive the descending conveyor belt 9 and the ascending conveyor belt 11 to move. Moreover, when angles of the descending conveyor belt 9 and the ascending conveyor belt 11 need to be adjusted, the rotary rod 21 can drive the main sprocket 22 to rotate, the main sprocket 22 can drive the chain 23 to rotate, and the chain 23 can drive the auxiliary sprocket 24 to rotate. The size of the auxiliary sprocket 24 is smaller than that of the main sprocket 22, which can accelerate the auxiliary sprocket 24. The auxiliary sprocket 24 can drive the connecting shaft 25 to rotate, the connecting shaft 25 can drive the two main bevel gears 26 to rotate, the two main bevel gears 26 can drive the two auxiliary bevel gears 27 to rotate, the two auxiliary bevel gears 27 can drive the two screw rods 28 to rotate, the two screw rods 28 can drive the slide bar 29 to rise and fall, and the slide bar 29 can drive the two sliding frames 30 to move, the two sliding frames 30 can slide on the surfaces of the two transmission frames 31 and drive the two transmission frames 31 to rotate, the two transmission frames 31 are rotatably connected to the slide bar 29 through bearings. The two transmission frames 31 can drive the two transmission rods 32 to move, and the two transmission rods 32 can drive the descending belt conveyor 9 and the ascending belt conveyor 11 to rotate, so as to adjust a tilting angle of the material discharge.

The above are merely exemplary embodiments of the present disclosure, but the scope of protection of the present disclosure is not limited thereto. Any person familiar with the technical field should be included in the scope of protection of the present disclosure by equivalent substitution or change according to the technical solutions and inventive concept of the present disclosure within the technical scope disclosed by the present disclosure.

What is claimed is:

1. A laboratory experiment system for breaching of a debris-typed barrier dam, wherein the laboratory experiment system comprises a large storage upstream reservoir (1);

wherein a main river channel (3) is connected to a water outlet of the large storage upstream reservoir (1), the debris-typed barrier dam (2) is built up in the main river channel (3), and uneroded dam bodies (6) are constructed on two side surfaces of the debris-typed barrier dam (2);

wherein a branch river channel (5) extends on a surface of the debris-typed barrier dam (2), and a material hopper (4) is connected to a feed inlet (34) of the branch river channel (5);

wherein river banks (7) are constructed on outer sides of the uneroded dam bodies (6), the feed inlet (34) of the branch river channel (5) is docked with a descending conveyor belt (9), a feeding end (35) of the descending conveyor belt (9) is docked with an ascending conveyor belt (11), a discharge end (36) of the material hopper (4) defines a bottom hole (13), the bottom hole (13) of the material hopper (4) is connected to a material pipe (12), and a discharge end (44) of the material pipe (12) corresponds to an inner side of the ascending conveyor belt (11);

wherein an adjusting mechanism is hinged between a bottom of the descending conveyor belt (9) and a bottom of the ascending conveyor belt (11), and a surface of the adjusting mechanism is rotatably sleeved with a lifting mechanism; and wherein the adjusting mechanism comprises: a base (18), a rotary frame (19), a supporting column (10) and a frame (20), a right side of a top of the base (18) is rotatably connected to a right end of the rotary frame (19), a number of the supporting column (10) is two, two sides of a top of the rotary frame (19) are respectively bolted to bottoms of the two supporting columns (10), the bottoms of the descending conveyor belt (9) and the ascending conveyor belt (11) are respectively hinged with two top ends of the two supporting columns (10), a bottom of the frame (20) is bolted to the top of the rotary frame (19), and the lifting mechanism is connected to the frame (20).

2. The laboratory experiment system as claimed in claim 1, wherein the lifting mechanism comprises: a rotary rod (21), a main sprocket (22), a chain (23) and a driving assembly, a left end (45) of the rotary rod (21) is connected to an axis center (46) of the main sprocket (22), a tooth (40) of the main sprocket (22) is meshed with an inner side of the chain (23), and the chain (23) is meshed with the driving assembly.

3. The laboratory experiment system as claimed in claim 2, wherein the driving assembly comprises: an auxiliary sprocket (24), a connecting shaft (25), a main bevel gear (26) and a transmission assembly, a top end of the chain (23) inside the chain (23) is meshed with a tooth (41) of the auxiliary sprocket (24), and an axis center (47) of the auxiliary sprocket (24) is connected to a left end (48) of the connecting shaft (25); and wherein a number of the main bevel gear (26) is two, axis centers (49) of the two main bevel gears (26) are connected to a surface of the connecting shaft (25), and the two main bevel gears (26) are meshed with the transmission assembly.

4. The laboratory experiment system as claimed in claim 3, wherein the transmission assembly comprises an auxiliary bevel gear (27), a screw rod (28), a slide bar (29) and a lifting assembly; and wherein a number of the auxiliary bevel gear (27) is two, a number of the screw rod (28) is two, a tooth (42) of each of the two main bevel gears (26) is meshed with a tooth (43) of a corresponding one of the two auxiliary bevel gears (27), axis centers of the two auxiliary bevel gear (27) are respectively connected to bottom ends of the two screw rods (28), the two screw rods (28) are threaddedly connected to threaded holes (37) of the slide bar (29), and the slide bar (29) is hinged to the lifting component.

5. The laboratory experiment system as claimed in claim 4, wherein the lifting assembly comprises a sliding frame (30), a transmission frame (31) and a transmission rod (32);

wherein a number of the sliding frame (30) is two, a number of the transmission frame (31) is two, and a number of the transmission rod (32) is two; and wherein rear sides of the two sliding frames (30) are hinged with a surface of the slide bar (29), the two sliding frames (30) are slidably connected to two surfaces of the two transmission frames (31), respectively, the two transmission frames (31) are hinged with the frame (20), an end of each of the two transmission frames (31) facing away from the frame (20) is hinged with a bottom end of a corresponding one transmission rod (32) of the two transmission rods (32), and a surface of the descending conveyor belt (9) and a surface of the ascending conveyor belt (11) are respectively hinged with two top ends of the two transmission rods (32).

6. The laboratory experiment system as claimed in claim 4, wherein the bottom end of each of the two screw rods (28) is rotatably sleeved with an inner side of the frame (20), a rear side of the slide bar (29) is slidably connected to a limiting frame (39), and a rear side of the limiting frame (39) is bolted to the inner side of the frame (20).

7. The laboratory experiment system as claimed in claim 3, wherein two ends of the rotary rod (21) are rotatably sleeved with an inner side of the frame (20), the two ends of the rotary rod (21) extend to an outer side of the frame (20) and are respectively connected to two rotating handles (38); and two ends of the connecting shaft (25) are rotatably sleeved with the inner side of the frame (20).

8. The laboratory experiment system as claimed in claim 1, wherein each of the descending conveyor belt (9) and the ascending conveyor belt (11) comprises a U-shaped conveyor belt (15), a rotating shaft (8), a supporting frame (16) and an adjustable speed motor (14); and wherein an inner side of supporting frame (16) is rotatably connected to two ends of the rotating shaft (8), the supporting frame (16) is bolted to the adjustable speed motor (14), the adjustable speed motor (14) is connected to the rotating shaft (8), and an inner side of the U-shaped conveyor belt (15) is rotatably connected to a surface of the rotating shaft (8).

* * * * *